United States Patent
Arens

(10) Patent No.: US 9,668,350 B2
(45) Date of Patent: May 30, 2017

(54) SEMICONDUCTOR MODULE WITH LOW INDUCTANCE LOAD CONNECTIONS

(71) Applicant: Infineon Technologies AG, Neubiberg (DE)

(72) Inventor: Andre Arens, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 87 days.

(21) Appl. No.: 14/709,605

(22) Filed: May 12, 2015

(65) Prior Publication Data

US 2015/0342055 A1    Nov. 26, 2015

(30) Foreign Application Priority Data

May 23, 2014   (DE) ......................... 10 2014 107 271

(51) Int. Cl.
*H05K 1/18* (2006.01)
*H01L 25/07* (2006.01)
(Continued)

(52) U.S. Cl.
CPC ......... *H05K 1/185* (2013.01); *H01L 23/4952* (2013.01); *H01L 23/49541* (2013.01); *H01L 23/49575* (2013.01); *H01L 23/5386* (2013.01); *H01L 23/5389* (2013.01); *H01L 25/072* (2013.01); *H01L 23/49844* (2013.01); *H01L 2924/0002* (2013.01); *H05K 2201/10507* (2013.01)

(58) Field of Classification Search
CPC ... H05K 1/185; H01L 25/072; H01L 23/5389; H01L 23/4952; H01L 23/49575; H01L 23/5386; H01L 23/49541; H01L 23/49844
See application file for complete search history.

(56) References Cited

U.S. PATENT DOCUMENTS 5,280,194 A * 1/1994 Richards ............. H01L 23/4822
257/724
6,991,470 B2 * 1/2006 Muench ................ H01L 23/057
174/261

(Continued)

FOREIGN PATENT DOCUMENTS

JP       2002033456 A * 1/2002

*Primary Examiner* — Nathan Milakovich
(74) *Attorney, Agent, or Firm* — Murphy, Bilak & Homiller, PLLC

(57) ABSTRACT

A semiconductor module includes a printed circuit board, and first and second embedded semiconductor chips. The first and second semiconductor chips each have a first load connection and a second load connection. The printed circuit board further includes a structured first metalization layer, which has a first section and a second section, and a structured second metalization layer, which has a first section, a second section and a third section. The first section of the second metalization layer and the second section of the first metalization layer have comb shaped structures having first and second protrusions. These first and second sections are electrically conductively connected to one another by a number of first plated-through holes each of which is permanently electrically conductively connected both at first protrusions to the first section of the second metalization layer and at second protrusions to the second section of the first metalization layer.

9 Claims, 4 Drawing Sheets

(51) Int. Cl.
*H01L 23/538* (2006.01)
*H01L 23/495* (2006.01)
H01L 23/498 (2006.01)

(56) References Cited

U.S. PATENT DOCUMENTS

| | | | |
|---|---|---|---|
| 7,057,275 B2* | 6/2006 | Schwarzbauer | H01L 24/49 257/691 |
| 7,791,208 B2* | 9/2010 | Bayerer | H01L 24/48 257/773 |
| 8,987,879 B2* | 3/2015 | Otremba | H01L 23/49524 257/676 |
| 9,123,983 B1* | 9/2015 | Oran | H01P 1/205 |
| 2009/0212873 A1* | 8/2009 | Shimizu | H01L 23/66 330/307 |
| 2016/0126192 A1* | 5/2016 | Hohlfeld | H01L 23/5389 257/668 |
| 2016/0247780 A1* | 8/2016 | Seler | H01L 23/66 |

\* cited by examiner

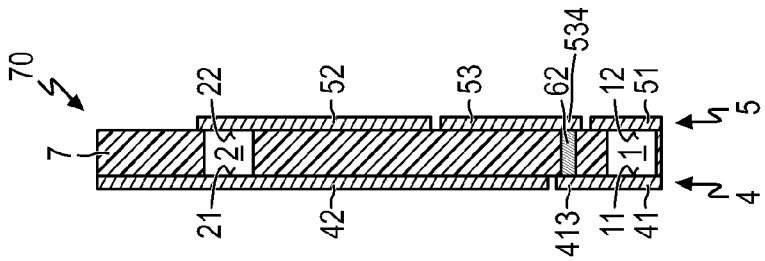
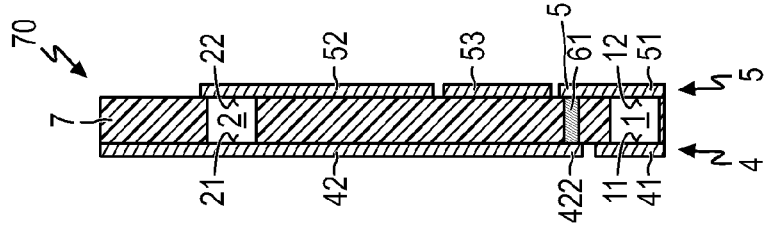
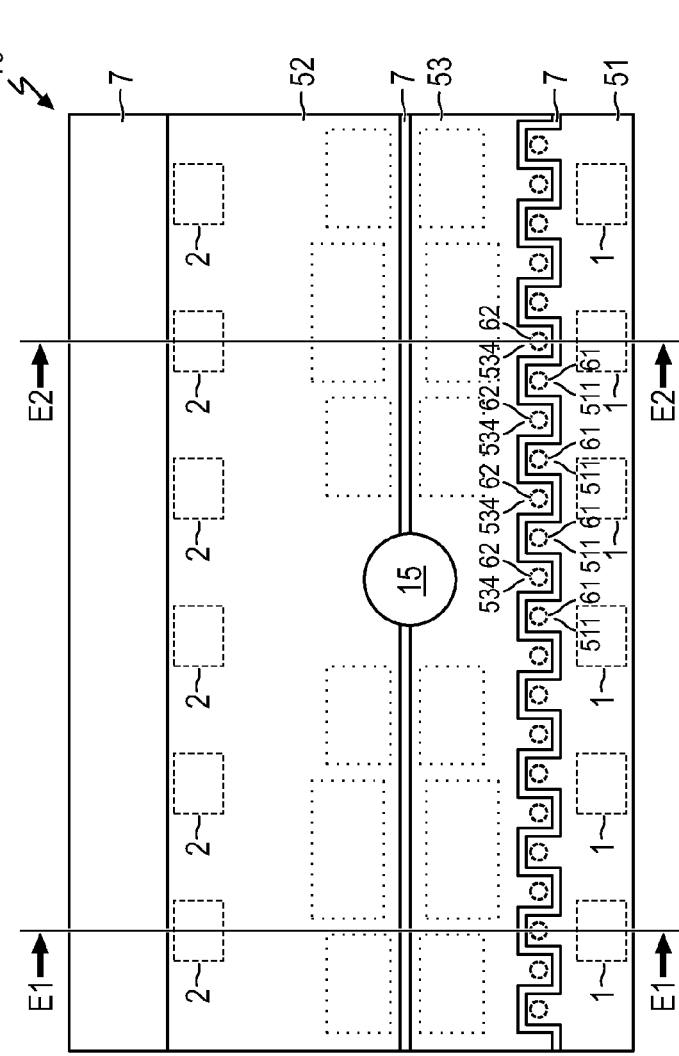

SEMICONDUCTOR MODULE WITH LOW INDUCTANCE LOAD CONNECTIONS

PRIORITY CLAIM

This application claims priority to German Patent Application No. 10 2014 10 2014 107 271.5 filed on 23 May 2014, the content of said application incorporated herein by reference in its entirety.

BACKGROUND

In conventional semiconductor modules, semiconductor chips are often used which have two load connections, which are arranged on mutually opposite sides of the semiconductor chip in question. In order to electrically interconnect them, the semiconductor chips are mounted on a carrier substrate. For this purpose, they are soldered at one of their load connections to a metalization of the carrier substrate, while the other of the load connections is connected by one or more bonding wires. Owing to the use of bonding wires, such semiconductor modules have, inter alia, a high inductance, which can result in undesired surges during operation of the semiconductor module.

SUMMARY

Embodiments described herein provide a low-inductance semiconductor module.

According to an embodiment, a printed circuit board includes a structured first metalization layer, which has a first section and a second section, and a structured second metalization layer, which has a first section and a second section. At least one first semiconductor chip is embedded in the printed circuit board, each of said semiconductor chips having a first load connection, and at least one second semiconductor chip embedded in the printed circuit board, each of said second semiconductor chips having a first load connection and a second load connection. The first section of the second metalization layer has a comb-shaped structure having a plurality of first protrusions. The second section of the first metalization layer has a comb-shaped structure having a plurality of second protrusions. The first section of the second metalization layer and the second section of the first metalization layer are electrically conductively connected to one another by virtue of the fact that the printed circuit board has a number of first plated-through holes, each of which is permanently electrically conductively connected both at one of the first protrusions to the first section of the second metalization layer and at one of the second protrusions to the second section of the first metalization layer.

BRIEF DESCRIPTION OF THE DRAWINGS

The invention will be explained below on the basis of exemplary embodiments with reference to the attached figures, in which:

FIG. 2A shows a plan view of a semiconductor module, according to an embodiment.

FIG. 2B shows a sectional view of the semiconductor module shown in FIG. 2A in a section plane E1-E1, according to an embodiment.

FIG. 2C shows a sectional view of the semiconductor module shown in FIG. 2A in a section plane E2-E2, according to an embodiment.

Where not specified otherwise, identical reference symbols denote identical or functionally identical elements in the figures.

DETAILED DESCRIPTION

Figure 1:
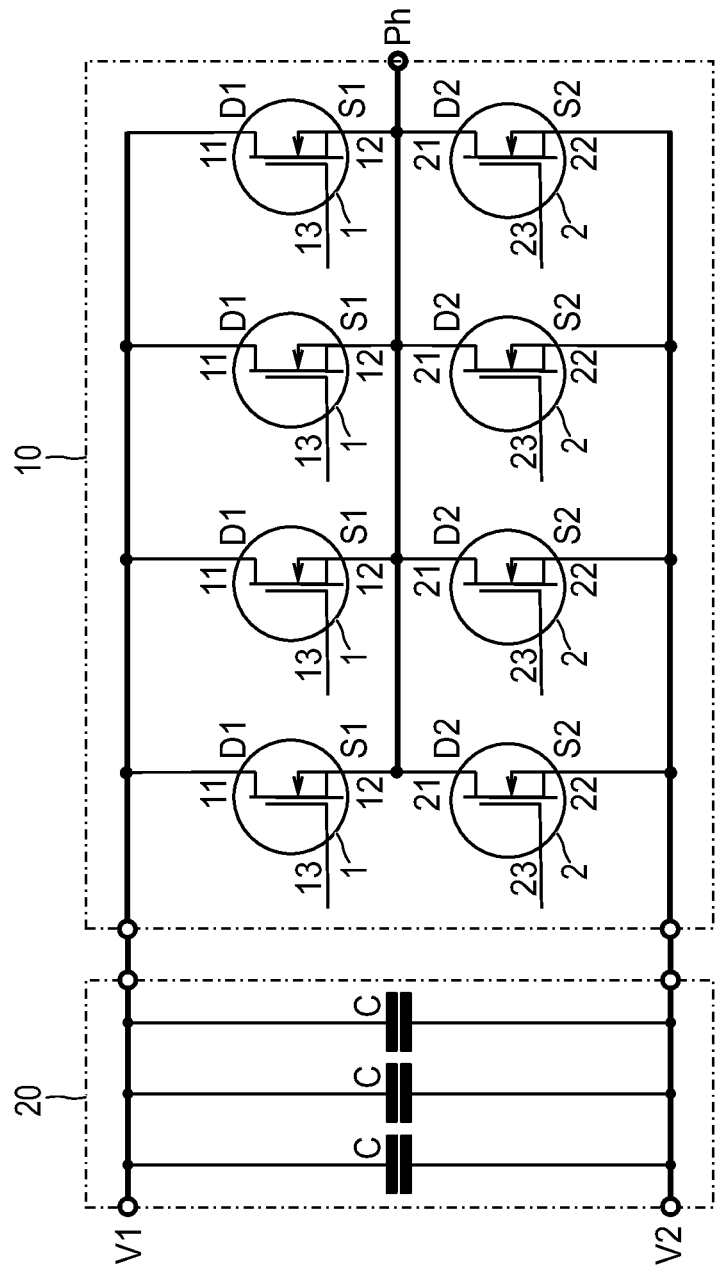
FIG. 1 shows a circuit diagram of a semiconductor arrangement comprising a semiconductor module and a DC-link module, according to an embodiment.

FIG. 1 shows a circuit diagram of a semiconductor module arrangement including a semiconductor module 10 and a DC-link capacitor module 20. The semiconductor module 10 has a half-bridge circuit including at least one first semiconductor chip 1 and at least one second semiconductor chip 2. In the case of more than one first semiconductor chip 1, the first semiconductor chips 1 are connected electrically in parallel with one another. Correspondingly, the second semiconductor chips 2, in the case of more than one second semiconductor chip 2, are connected electrically in parallel with one another. In the example shown, the first semiconductor chips 1 and the second semiconductor chips 2 are in the form of MOSFETs. Likewise, the first semiconductor chips 1 and the second semiconductor chips 2 could also be in the form of IGBTs, thyristors, or any other desired controllable semiconductor components, or in the form of diodes. In principle, the set of first and second semiconductor chips 1, 2 can include different types of semiconductor components, however.

Each of the first semiconductor chips 1 has a first load connection 11 and a second load connection 12. Each of the second semiconductor chips 2 also has a first load connection 21 and a second load connection 22. The first and second load connections of a first or second semiconductor chip may be, for example, a drain connection and a source connection of this semiconductor chip or a source connection and a drain connection or an emitter connection and a collector connection or a collector connection and an emitter connection or an anode connection and a cathode connection or a cathode connection and an anode connection.

Optionally, the first semiconductor chips 1 can each also have a control connection 13 and/or the second semiconductor chips 2 can optionally in each case also have a control connection 23. Such control connections 13, 23 can be gate or base connections. A load path formed between the first and second load connections of the same semiconductor chip can be switched on (i.e., placed in an electrically conductive state) or switched off (i.e., placed in an electrically off or non-conducting state) with the aid of the control connections.

In the case of two or more first semiconductor chips 1, the first load connections 11 thereof can be electrically conductively connected to one another, and also the second load connections 12 thereof can be electrically conductively connected to one another. If the at least two first semiconductor chips 1 in this case each have a control connection 13, said control connections are also electrically conductively connected to one another (not shown in FIG. 1 for reasons of clarity). Alternatively, a gate resistor can also be connected upstream of each of the control connections 13. In this case, the control connections 13 are not connected directly to one another via one or more low-resistance connecting lines, but those connections of the gate resistors which are electrically remote from the associated control connection 13.

Correspondingly, in the case of two or more semiconductor chips 2, the first load connections 21 thereof are electrically conductively connected to one another, and also the second load connections 22 thereof are electrically conductively connected to one another. If the at least two second semiconductor chips 2 in this case each have a control connection 23, said control connections are also electrically conductively connected to one another (not shown in FIG. 1 for reasons of clarity). Alternatively, a gate resistor can also be connected upstream of each of the control connections 23. In this case, the control connections 23 are not connected directly to one another via one or more low-resistance connecting lines, but those connections of the gate resistors which are electrically remote from the associated control connection 13.

Irrespective of how many first semiconductor chips 1 and how many second semiconductor chips 2 are provided, the first load connections 21 of the second semiconductor chips 2 are electrically conductively connected to the second load connections 12 of the first semiconductor chips 1 and to a phase output Ph. As a result, a half-bridge circuit is produced, with it being possible for the first load connections 11 of the first semiconductor chips 1 to be connected to a first electrical supply potential V1 and for the second load connections 22 of the second semiconductor chips 2 to be connected to a second electrical supply potential V2, which is different than the first electrical supply potential V1, for the operation of said half-bridge circuit. In the exemplary embodiment shown in FIG. 1, V1 is greater than V2, but V1 can in principle also be selected to be less than V2, depending on the type of first and second semiconductor chips 1, 2.

If the load paths of one, a plurality of or all of the first semiconductor chips 1 are switched on and at the same time the load paths of all of the second semiconductor chips 2 are switched off, the first supply potential V1 is present at the phase output Ph (apart from a small voltage drop across the load paths of the first semiconductor chips 1). Correspondingly conversely, the second supply potential V2 is present at the phase output Ph (apart from a small voltage drop across the load paths of the second semiconductor chips 2) if the load paths of one, a plurality of or all of the second semiconductor chips 2 are switched on and at the same time the load paths of all of the first semiconductor chips 1 are switched off.

The DC-link capacitor module 20 has one or more capacitors C, which are connected electrically in parallel with one another in the case of at least two capacitors C. The DC-link capacitor module 20 is electrically connected to the semiconductor module 10 by virtue of the fact that, of the two connections in this parallel circuit, one is connected to the first load connections 11 of all of the first semiconductor chips 1, and the other is connected to the second load connections 22 of all of the second semiconductor chips 2.

FIG. 2A shows a plan view of a semiconductor module 10, which can include a circuit, for example, as has been explained with reference to FIG. 1. The semiconductor module 10 has a printed circuit board, in which all of the first semiconductor chips 1 and all of the second semiconductor chips 2 are embedded. In the view shown in FIG. 2A, the positions of the first and second semiconductor chips 1, 2 are hidden and therefore only illustrated by dashed lines. FIGS. 2B and 2C show sectional views of the semiconductor module 10 shown in FIG. 2A in section planes E1-E1 and E2-E2, respectively.

The semiconductor module 10 has a printed circuit board 70 including a first metalization layer 4 and a second metalization layer 5, and a dielectric 7 arranged between the first metalization layer 4 and the second metalization layer 5. The first semiconductor chips 1 and the second semiconductor chips 2 are likewise arranged between the first metalization layer 4 and the second metalization layer 5 and therefore embedded in the printed circuit board 70. In addition, the printed circuit board 70 has an optional through-opening 15 for receiving a fastening screw. The first metalization layer 4 and/or the second metalization layer 5 can, in each case optionally, be in the form of a flat layer.

Each of the first semiconductor chips 1 has a first load connection 11 and a second load connection 12, which are arranged on mutually opposite sides of the first semiconductor chip 1 in question. Correspondingly, each second semiconductor chip 2 has a first load connection 21 and a second load connection 22. The first load connections 11 and 21 are each located on that side of the semiconductor chip 1, 2 in question which faces the first metalization layer 4, and the second load connections 12 and 22 are each on that side of the semiconductor chip 1, 2 in question which faces the second metalization layer 5.

The first metalization layer 4 has at least two sections, namely a first section 41 and a second section 42. In addition, the second metalization layer 5 has at least three sections, namely a first section 51, a second section 52 and a third section 53. The sections 41, 42, 51, 52, 53 are each contiguous. This means that two arbitrary points on the contiguous section in question are electrically conductively connected to one another. Furthermore, different ones of the sections 41, 42, 51, 52, 53 are spaced apart from one another and are not, or at least not permanently, electrically conductively connected to one another.

The second load connection 12 of each first semiconductor chip 1 is permanently electrically conductively connected to the first section 51 of the second metalization layer 5, the first load connection 21 of each second semiconductor chip 2 is permanently electrically conductively connected to the second section 42 of the first metalization layer 4. In order to connect the parallel circuit of load paths of the first semiconductor chips 1 in series with the parallel circuit of load paths of the second semiconductor chips 2, as shown in FIG. 1, the second load connections 12 of the first semiconductor chips 1 and the first load connections 21 of the second semiconductor chips 2 are permanently electrically conductively connected to one another, which takes place with the aid of a plurality of first plated-through holes 61, which each connect the second section 42 of the first metalization layer 4 and the first section 51 of the second metalization layer 5 permanently electrically conductively to one another.

For this purpose, the first section 51 of the second metalization layer 5 has a comb-shaped structure including a plurality of first protrusions 511, and the second section 42 of the first metalization layer 4 likewise has a comb-shaped structure including a plurality of second protrusions 422. Each of the first plated-through holes 61 is arranged between one of the first protrusions 511 and one of the second protrusions 422 and in this case is connected at these protrusions 511 and 422 to the second metalization layer 5 and to the first metalization layer 4, respectively. In each case one of the first protrusions 511 and one of the second protrusions 422 form a pair so that a plurality of, for example at least three, at least four or at least five, different pairs (511; 422) are present, between which in each case one other of the first plated-through holes 61 is arranged and this pair is permanently electrically conductively connected at the protrusions 511 and 422 to the first section 51 of the second metalization layer 5 and to the second section 42 of the first metalization layer 4, respectively. By virtue of the permanently electrically conductive connection between the first section 51 of the second metalization layer 5 and the second section 42 of the first metalization layer 4 at the protrusions 511 and 422, respectively, thereof which form the respective comb-shaped structure, which permanent electrically conductive connection is realized with the aid of the first plated-through holes 61, a very low-inductance electrical connection is produced between the second load connections 12 of the first semiconductor chips 1 and the first load connections 21 of the second semiconductor chips 2.

Optionally, the semiconductor module 10 can also have a further permanently electrically conductive connection realized with the aid of plated-through holes and comb-shaped structures, between a section of the first metalization layer 4 and a section of the second metalization layer 5, as is the case, by way of example, between the first section 41 of the first metalization layer 4 and the third section 53 of the second metalization layer 5.

For this purpose, the first section 41 of the first metalization layer 4 has a comb-shaped structure including a plurality of third protrusions 413, and the third section 53 of the second metalization layer 5 has a comb-shaped structure including a plurality of fourth protrusions 534. Each of the second plated-through holes 62 is arranged between one of the third protrusions 413 and one of the fourth protrusions 534 and in the process is connected at these protrusions 534 and 413 to the second metalization layer 5 and to the first metalization layer 4, respectively. In each case one of the third protrusions 413 and one of the fourth protrusions 534 form a pair, so that a plurality of, for example at least three, at least four or at least five, different pairs (413; 534) are present, between which in each case one other of the second plated-through holes 62 is arranged and is permanently electrically conductively connected at the protrusions 534 and 413 of this pair to the third section 53 of the second metalization layer 5 and to the first section 41 of the first metalization layer 4, respectively.

FIG. 2A in addition also shows, in each case with dotted lines, the fitting area for fitting electrical connection lugs (for example connection lugs 65, 66, as will be explained with reference to FIG. 5), at which the connection lugs can be fitted on the second metalization layer 5.

Figure 3:
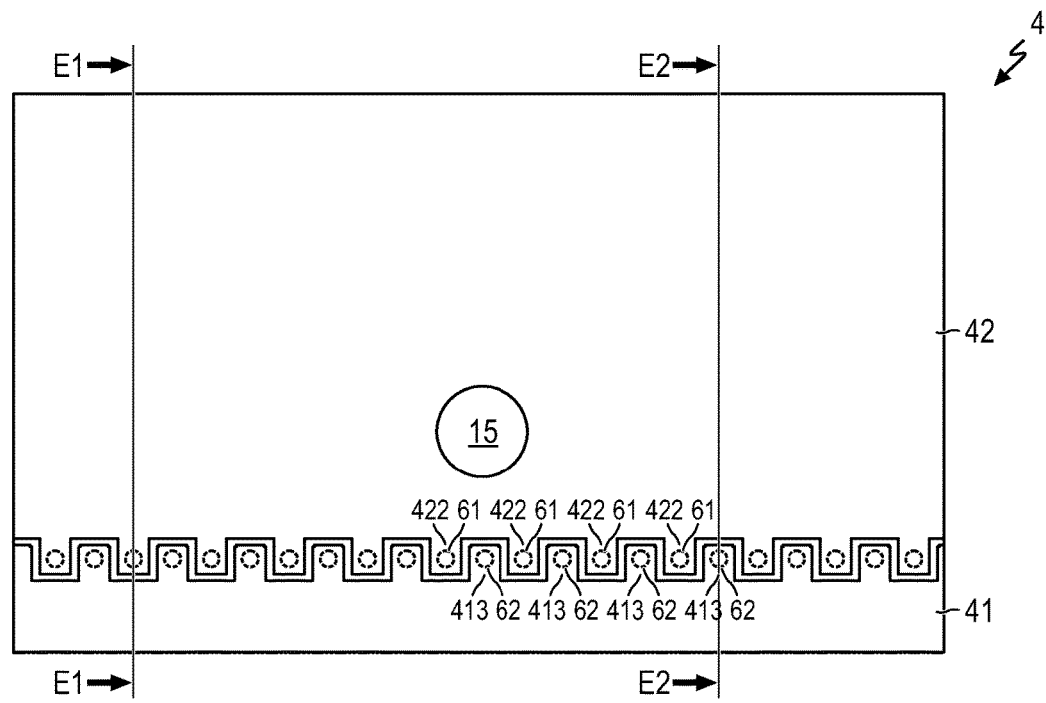
FIG. 3 shows a plan view of the first metalization layer of the printed circuit board of the semiconductor module shown in FIG. 2A, according to an embodiment.
Figure 4:
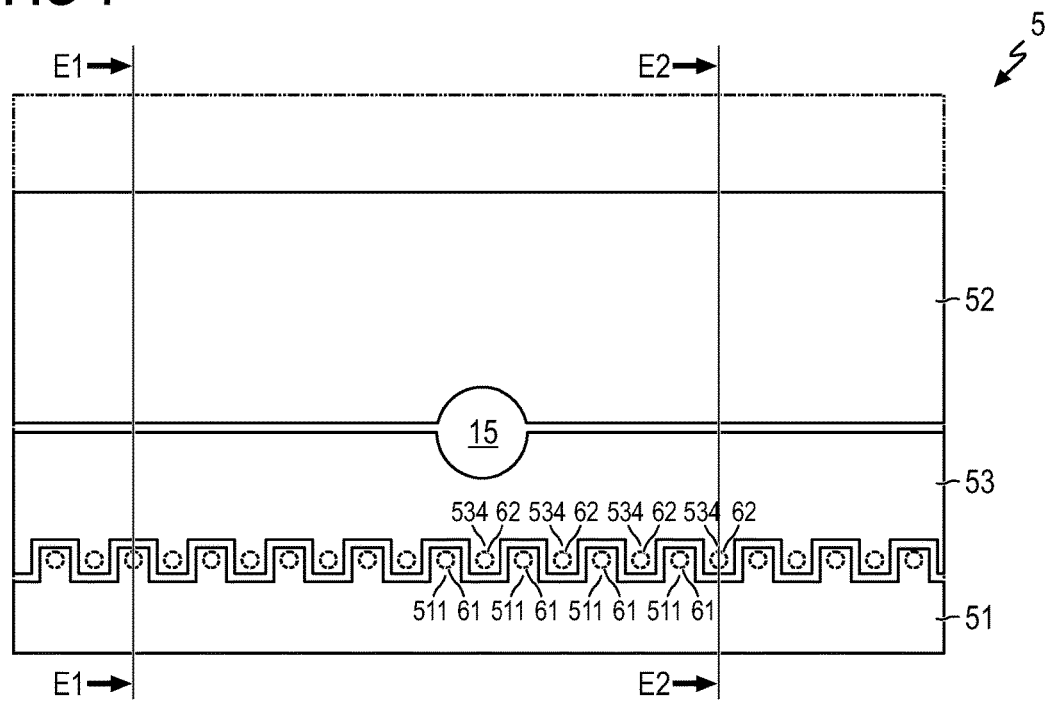
FIG. 4 shows a plan view of the second metalization layer of the printed circuit board of the semiconductor module shown in FIG. 2A, according to an embodiment.

FIG. 3 shows only the first metalization layer 4 with its first and second sections 41 and 42, respectively, in plan view. Correspondingly, FIG. 4 only shows the second metalization layer 5 with its first, second and third sections 51, 52 and 53, likewise in plan view. The viewing directions in FIGS. 3 and 4 are in this case identical to the viewing direction shown in FIG. 2A. Insofar as the second metalization layer 5 does not extend as far as the lateral edge of the printed circuit board 70 in FIG. 4, this lateral edge is illustrated using dash-dotted lines with single dashes and double dots. In addition, the positions of the first and second plated-through holes 61 and 62, respectively, are illustrated using dashed circles in both FIGS. 3 and 4.

In accordance with one option illustrated in FIG. 3, the comb-shaped structure of the first section 41 of the first metalization layer 4 and the comb-shaped structure of the second structure 42 of the first metalization layer 4 can mesh with one another, as a result of which the second protrusions 422 and the third protrusions 413 are arranged in series along a straight line.

Correspondingly, in accordance with an option illustrated in FIG. 4, the comb-shaped structure of the first section 51 of the second metalization layer 5 and the comb-shaped structure of the third section 53 of the second metalization layer 5 can mesh with one another, as a result of which the first protrusions 511 and the fourth protrusions 534 are arranged in series along a straight line.

Owing to the electrically conductive connection between two sections of different metalization layers of a printed circuit board (said metalization layers in each case being flat, spaced apart from one another and running parallel to one another, for example) and with the aid of plated-through holes, which are each permanently electrically conductively connected both at one protrusion of a comb-like structure of one of these sections to this section and at one protrusion of a comb-like structure of the other of these sections to this other section, an electrical potential can be transferred at low inductance from one metalization layer into the other metalization layer. As a result, it is possible to dispense with the use of bonding wires for producing an electrically conductive connection between the two sections. The advantage of the low-inductance electrically conductive connection consists in that the occurrence of hazardous surges, for example during disconnection of an electrical current flowing through the first or second semiconductor chips 1, 2, can be avoided.

With the aid of such electrical connections, for example, it is also possible to achieve a very simple design of the semiconductor module 10. For example, a printed circuit board 70 can have only precisely two metalization layers running parallel to one another in different planes. In principle, however, a printed circuit board 70 can also have more than two metalization layers 4, 5 arranged in at least three pairwise different planes and running parallel to one another.

In the exemplary embodiments shown, the first and/or the second metalization layer 4, 5 can also have further conductor tracks, for example for interconnecting the gate connections 13 and 23 (FIG. 1), but these further conductor tracks are not illustrated in the Figures for reasons of clarity.

Figure 5:
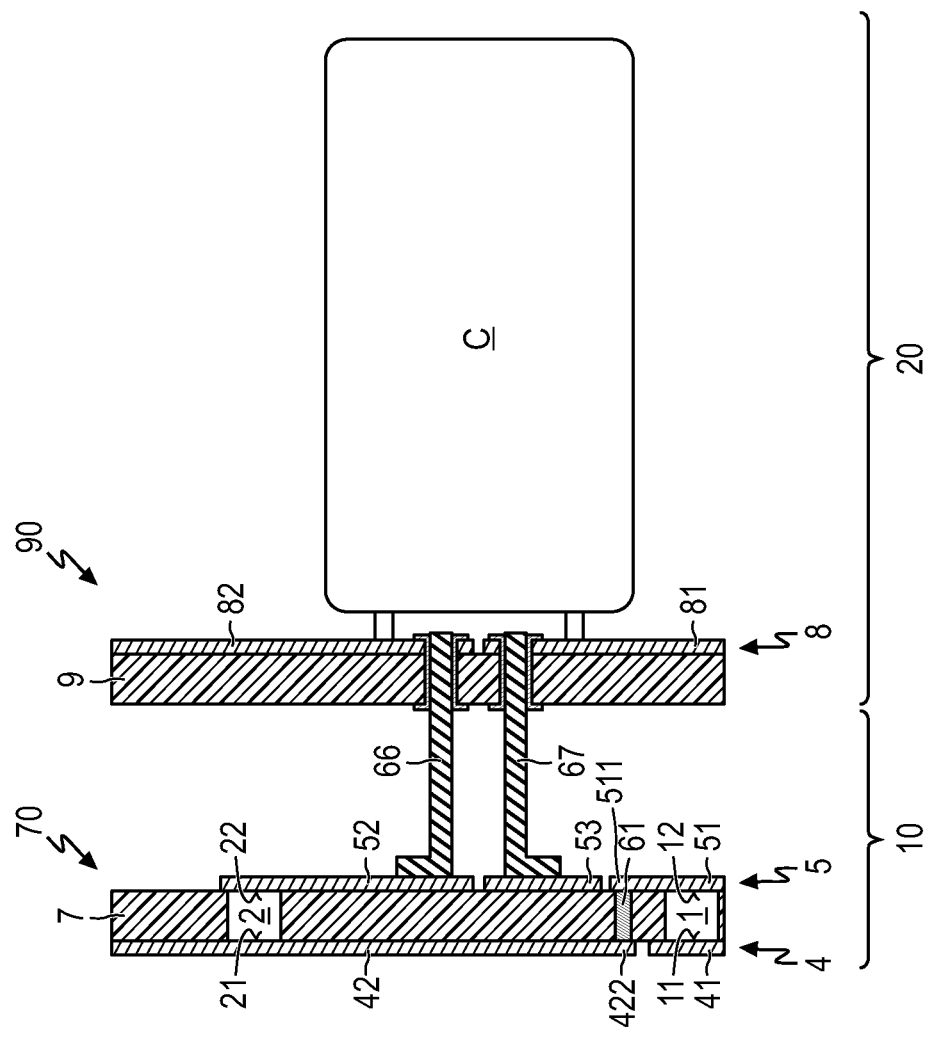
FIG. 5 shows a sectional view of a semiconductor module arrangement comprising a semiconductor module shown in FIG. 2B and a DC-link capacitor module connected thereto, according to an embodiment.

FIG. 5 also shows a semiconductor arrangement in which a DC-link capacitor module 20 is connected to the semiconductor module 10 shown in FIG. 2B. The DC-link capacitor module 20 has a further printed circuit board 90 including at least one structured metalization layer 8 on a dielectric carrier 9. The further printed circuit board 90 is populated with one or more DC-link capacitors C, which can be connected electrically in parallel with one another, as explained with reference to FIG. 1, in the case of a plurality of DC-link capacitors C.

The electrical connection between the semiconductor module 10 and the DC-link capacitor module 20 is performed with the aid of at least two connection lugs 65, 66 of the semiconductor module 10, each of which connection lugs is cohesively and electrically conductively connected to a section 52, 53 of the second metalization layer 5 at one end. At their other ends, the connection lugs 65, 66 can be connected to different sections 81 and 82, respectively, of the metalization layer 8, in each case in any desired manner, for example by means of being pressed in or soldered in. For this purpose, each of the sections 81 and 82 can have a press-in opening or soldering opening. As an alternative to a further printed circuit board 90, the electrical connection between the populated first printed circuit board 70 and the DC-link capacitor(s) C can also be provided with the aid of a metallic busbar, which contains at least two sheet-metal strips.

What is claimed is:

1. A semiconductor module, comprising:
a printed circuit board comprising a structured first metalization layer, which has a first section and a second section, and comprising a structured second metalization layer, which has a first section, a second section and a third section;
at least one first semiconductor chip which is embedded in the printed circuit board, each of the at least one first semiconductor chips having a first load connection and a second load connection; and
at least one second semiconductor chip, which is embedded in the printed circuit board, each of the at least one second semiconductor chips having a first load connection and a second load connection;
wherein:
the first section of the second metalization layer has a comb-shaped structure comprising a plurality of first protrusions;
the second section of the first metalization layer has a comb-shaped structure comprising a plurality of second protrusions;
the first section of the second metalization layer and the second section of the first metalization layer are electrically conductively connected to one another by virtue of the fact that the printed circuit board has a number of first plated-through holes, each of which is permanently electrically conductively connected both at one of the first protrusions to the first section of the second metalization layer and at one of the second protrusions to the second section of the first metalization layer;
each of the first semiconductor chips and each of the second semiconductor chips is arranged between the first metalization layer and the second metalization layer;
wherein the first section of the first metalization layer is configured as a first power supply terminal that is conductively connected to the first load connection of each of the first semiconductor chips,
wherein the second section of the second metalization layer is configured as a second power supply terminal that is conductively connected to the first load connection of each of the second semiconductor chips; and
wherein the second load connection of each of the first semiconductor chips is electrically connected to the first load connection of each of the second semiconductor chips by the first section of the second metalization layer, the second section of the first metalization layer and the first plated-through holes.

2. The semiconductor module as claimed in claim 1, wherein each of the first plated-through holes is arranged between another pair of in each case one of the first protrusions and one of the second protrusions.

3. The semiconductor module as claimed in claim 1, wherein the second section of the first metalization layer and the first section of the second metalization layer are not electrically conductively connected to one another by a wire bond connection.

4. The semiconductor module as claimed in claim 1, wherein
the first section of the first metalization layer has a comb-shaped structure comprising a plurality of third protrusions;
the third section of the second metalization layer has a comb-shaped structure comprising a plurality of fourth protrusions; and
the first section of the first metalization layer and the third section of the second metalization layer are electrically conductively connected to one another by virtue of the fact that the printed circuit board has a number of second plated-through holes, each of which is permanently electrically conductively connected both at one of the third protrusions to the first section of the first metalization layer and at one of the fourth protrusions to the third section of the second metalization layer.

5. The semiconductor module as claimed in claim 4, wherein
the comb-shaped structure of the first section of the first metalization layer and the comb-shaped structure of the second section of the first metalization layer mesh with one another; and/or
the comb-shaped structure of the first section of the second metalization layer and the comb-shaped structure of the third section of the second metalization layer mesh with one another.

6. The semiconductor module as claimed in claim 1, wherein the first section of the first metalization layer and the third section of the second metalization layer are not electrically conductively connected to one another by a wire bond connection.

7. The semiconductor module as claimed in claim 1, wherein
the first metalization layer is in the form of a flat layer; and/or
the second metalization layer is in the form of a flat layer.

8. The semiconductor module as claimed in claim 1, wherein the second section of the second metallization layer is electrically disconnected from the first metallization layer.

9. The semiconductor module as claimed in claim 8, wherein the second section of the second metallization layer completely overlaps with the second section of the first metallization layer.

* * * * *

UNITED STATES PATENT AND TRADEMARK OFFICE
CERTIFICATE OF CORRECTION

PATENT NO. : 9,668,350 B2
APPLICATION NO. : 14/709605
DATED : May 30, 2017
INVENTOR(S) : A. Arens It is certified that error appears in the above-identified patent and that said Letters Patent is hereby corrected as shown below:

Column 8, Line 47 (Claim 8, Line 2), please change "metallization" to -- metalization --.
Column 8, Line 48 (Claim 8, Line 3), please change "metallization" to -- metalization --.
Column 8, Line 50 (Claim 9, Line 2), please change "metallization" to -- metalization --.
Column 8, Line 51 (Claim 9, Line 4), please change "metallization" to -- metalization --.

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*